(12) United States Patent
Bush et al.

(10) Patent No.: US 6,977,195 B1
(45) Date of Patent: Dec. 20, 2005

(54) TEST STRUCTURE FOR CHARACTERIZING JUNCTION LEAKAGE CURRENT

(75) Inventors: John J. Bush, Leander, TX (US); Wen-Jie Qi, Austin, TX (US); Robert Dawson, Austin, TX (US)

(73) Assignee: FASL, LLC, Sunnyvale, CA (US)

( * ) Notice: Subject to any disclaimer, the term of this patent is extended or adjusted under 35 U.S.C. 154(b) by 0 days.

(21) Appl. No.: 10/919,119

(22) Filed: Aug. 16, 2004

(51) Int. Cl.[7] .................. H01L 21/336; H01L 21/8234
(52) U.S. Cl. ...................... 438/197; 438/224; 438/227
(58) Field of Search ............................... 438/197, 217, 438/218, 220, 224, 227

(56) References Cited

U.S. PATENT DOCUMENTS 5,455,450 A * 10/1995 Leduc ........................ 257/591

6,803,644 B2 * 10/2004 Minami et al. ............. 257/606

* cited by examiner

Primary Examiner—Phuc T. Dang
(74) Attorney, Agent, or Firm—Monica H. Choi (57) ABSTRACT

For characterizing bulk leakage current of a junction, a center junction surrounded by an isolation structure is formed with a first depth. In addition, at least one periphery junction having a second depth greater than the first depth is formed in a portion of the center junction adjacent the isolation structure. A junction silicide is formed with the center and periphery junctions. The magnitude of a reverse-bias voltage across the junction silicide and the P-well is incremented for determining a critical magnitude of the reverse-bias when current through the junction silicide and the P-well reaches a threshold current density.

20 Claims, 8 Drawing Sheets

TEST STRUCTURE FOR CHARACTERIZING JUNCTION LEAKAGE CURRENT

TECHNICAL FIELD

The present invention relates generally to testing during integrated circuit fabrication, and more particularly, to a test structure for reliably characterizing junction leakage current for an integrated circuit such as drain leakage current for a flash memory device.

BACKGROUND OF THE INVENTION

Figure 1:
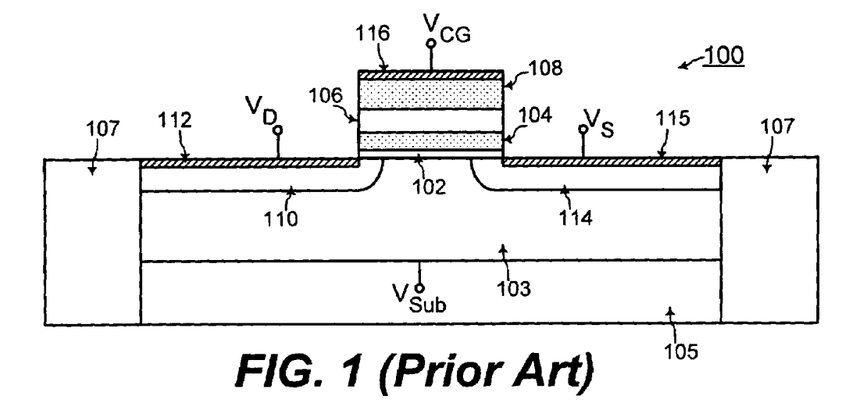
FIG. 1 shows a cross-sectional view of a flash memory cell, according to the prior art.

Referring to a cross-sectional view of FIG. 1, a flash memory cell 100 of a flash memory device includes a tunnel dielectric structure 102 typically comprised of silicon dioxide ($SiO_2$) or nitrided oxide as known to one of ordinary skill in the art of integrated circuit fabrication. The tunnel dielectric structure 102 is disposed on a P-well 103 formed within a semiconductor substrate 105. In addition, a floating gate structure 104, comprised of a conductive material such as polysilicon for example, is disposed over the tunnel dielectric structure 102.

In addition, a floating dielectric structure 106, typically comprised of silicon dioxide ($SiO_2$), is disposed over the floating gate structure 104. A control gate structure 108, comprised of a conductive material, such as polysilicon for example, is disposed over the dielectric structure 106. The tunnel dielectric structure 102, the floating gate structure 104, the floating dielectric structure 106, and the control gate structure 108 form a gate stack of the flash memory cell 100.

A drain bit line junction 110 is formed toward the left of the gate stack of the flash memory cell 100 within an active device area of the P-well 103 defined by a STI (shallow trench isolation) structure 107. Similarly, a source bit line junction 114 is formed toward the right of the gate stack of the flash memory cell 100 within the active area of the P-well 103. When the P-well 103 is doped with a P-type dopant, the drain and source bit line junctions 110 and 114 are doped with an N-type dopant, such as arsenic (As) or phosphorous (P) for example, for forming an N-channel flash memory cell 100.

Alternatively, the flash memory cell 100 is fabricated without the N-type dopant being implanted for the source side. In that case, the source bit line is formed from the portion of the active device area 103 toward the right of the gate stack.

A drain silicide 112 is formed with the drain junction 110, and a source silicide 115 is formed with the source junction 114, for providing contact to the drain and source bit line junctions 110 and 114. In addition, a gate silicide 116 is formed with the control gate structure 108 for providing contact to the control gate 108 of the flash memory cell 100.

During the program or erase operations of the flash memory cell 100 of FIG. 1, charge carriers are injected into or tunneled out of the floating gate structure 104. Such variation of the amount of charge carriers within the floating gate structure 104 alters the threshold voltage of the flash memory cell 100, as known to one of ordinary skill in the art of flash memory technology.

For example, when electrons are the charge carriers that are injected into the floating gate structure 104, the threshold voltage increases. Alternatively, when electrons are the charge carriers that are tunneled out of the floating gate structure 104, the threshold voltage decreases. These two conditions are used as the two states for storing digital information within the flash memory cell 100, as known to one of ordinary skill in the art of electronics.

Figure 2:
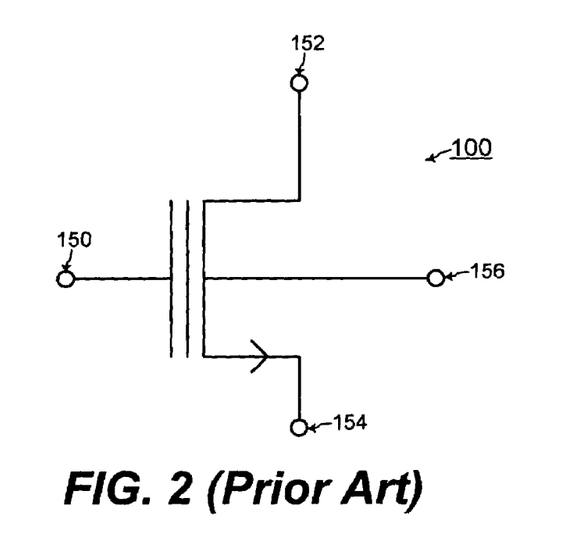
FIG. 2 shows a circuit diagram representation of the flash memory cell of FIG. 1, according to the prior art.
Figure 3:
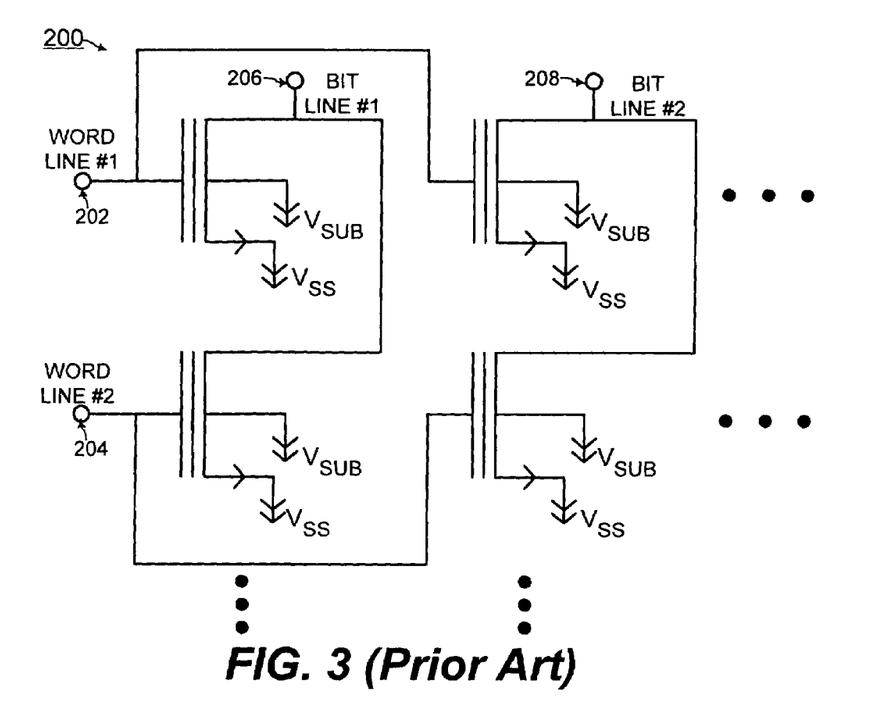
FIG. 3 shows an array of flash memory cells comprising a flash memory device, according to the prior art.

FIG. 2 illustrates a circuit diagram representation of the flash memory cell 100 of FIG. 1 including a control gate terminal 150 coupled to the gate silicide 116, a drain terminal 152 coupled to the drain silicide 112, a source terminal 154 coupled to the source silicide 115, and a P-well terminal 156 coupled to the P-well 103. FIG. 3 illustrates a flash memory device 200 comprised of an array of flash memory cells, as known to one of ordinary skill in the art of flash memory technology. Referring to FIG. 3, the array of flash memory cells 200 includes rows and columns of flash memory cells with each flash memory cell having similar structure to the flash memory cell 100 of FIGS. 1 and 2. The array of flash memory cells 200 of FIG. 3 is illustrated with two columns and two rows of flash memory cells for simplicity and clarity of illustration. However, a typical array of flash memory cells comprising an electrically erasable and programmable memory device has more numerous rows and columns of flash memory cells.

Further referring to FIG. 3, in the array of flash memory cells 200 comprising a flash memory device, the control gate terminals of all flash memory cells in a row of the array are coupled together to form a respective word line for that row. In FIG. 3, the control gate terminals of all flash memory cells in the first row are coupled together to form a first word line 202, and the control gate terminals of all flash memory cells in the second row are coupled together to form a second word line 204.

In addition, the drain terminals of all flash memory cells in a column are coupled together to form a respective bit line for that column. In FIG. 3, the drain terminals of all flash memory cells in the first column are coupled together to form a first bit line 206, and the drain terminals of all flash memory cells in the second column are coupled together to form a second bit line 208. Further referring to FIG. 3, the source terminal of all flash memory cells of the array 200 are coupled together to a source voltage $V_{SS}$, and the P-well terminal of all flash memory cells of the array 200 are coupled together to a substrate voltage $V_{SUB}$ during some modes of operation of the flash memory cell. Such a circuit of the array of flash memory cells comprising the flash memory device 200 is known to one of ordinary skill in the art of flash memory technology.

For efficient operation of the flash memory cell 100, the leakage current through the drain bit line junction 110 is desired to be minimized. Thus, during fabrication of the flash memory cell 100, the leakage current through the drain bit line junction 110 is desired to be characterized. Referring to a cross-sectional view of FIG. 4, a test junction 212 is fabrication for such characterizing of the junction leakage current. The test junction 212 is formed from implantation of a core dopant which is also implanted into the active device area 103 in FIG. 1 before formation of the gate stack of the flash memory cell 100.

Figure 4:
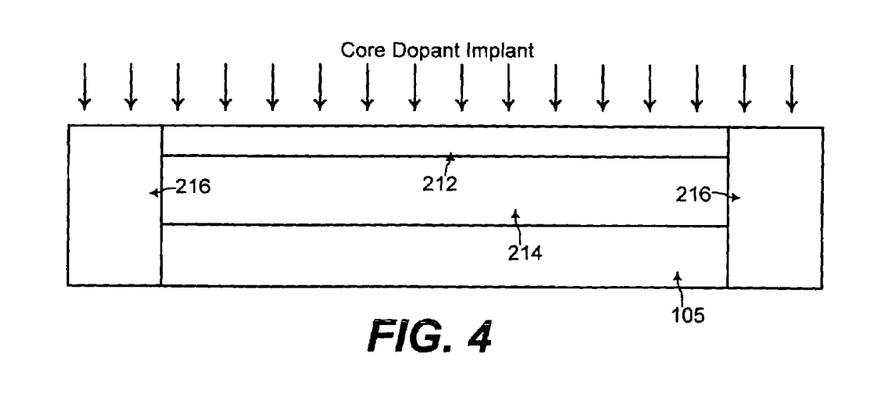
FIGS. 4, 5, 6, and 7 show cross-sectional views illustrating fabrication of a test junction with an extended portion of a junction silicide that contributes significant leakage current to taint characterization of the bulk junction leakage current.

Referring to FIG. 4, a P-well 214 is formed within the substrate 105, and the core dopant is implanted into the P-well 214. The core dopant is typically a P-type dopant such as boron for example. The P-well and the junction 212 are surrounded by a STI (shallow trench isolation) structure 216.

Figure 5:
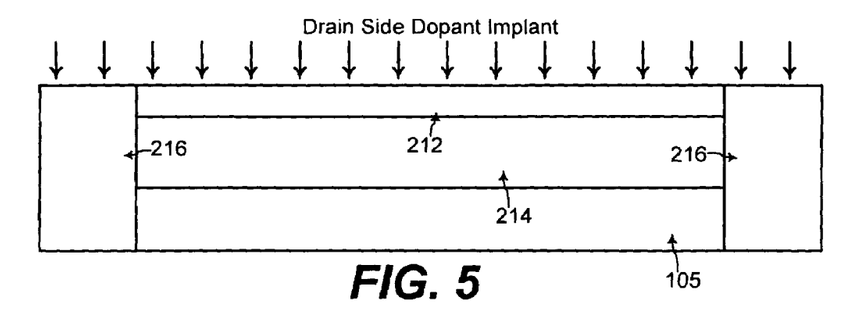

Furthermore, referring to FIG. 5, for emulating the drain bit line junction 110, a drain side dopant is implanted into the test junction 212. The drain side dopant is typically an N-type dopant and is also implanted to form the drain bit line junction 110 of the flash memory cell 100. The combination of the core dopant and the drain side dopant implanted into the test junction 212 typically results in an overall N-type junction 212, and emulates the drain bit line junction 110 of the flash memory cell 100.

Figure 6:
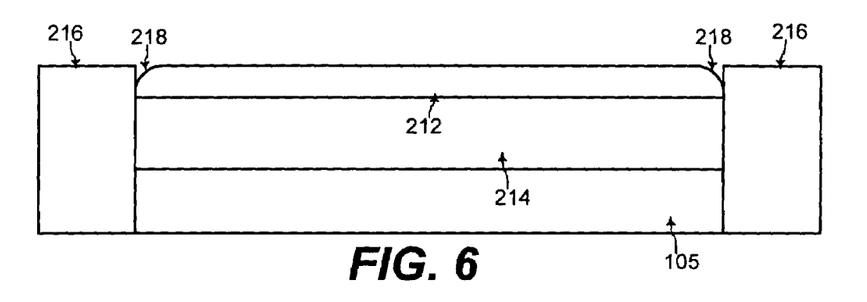
Figure 7:
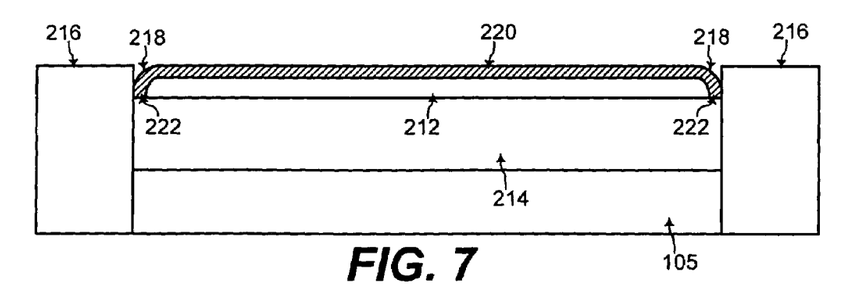

Referring to FIG. 6, during subsequent fabrication processes, which typically includes etching processes, the top corners 218 of the test junction 212 become etched and rounded adjacent the isolation structure 216. Referring to FIG. 7, subsequently, when a silicide 220 is formed with the junction 212, an extended portion 222 of the silicide 220 extends lower into the junction 212 at the corners 218. The extend portion 222 of the silicide 220 may even punch through the depth of the junction 212.

When a voltage bias is applied across the silicide 220 and the P-well 214 for characterizing leakage current, a high level of leakage current flows through the extended portion 222 of the silicide 220 that extends near or even punches through the junction 212. Such leakage current through the extended portion 222 of the silicide 220 taints the measure of leakage current through the interface between the test junction 212 and the P-well 214 (i.e., the bulk component of the leakage current). In this manner, with the test junction 212 and silicide 220 of FIG. 7, the substantially bulk component of the leakage current through the test junction 212 is not accurately characterized.

Thus, a junction test structure that allows the substantially bulk component of the leakage current to be accurately characterized is desired.

SUMMARY OF THE INVENTION

Accordingly, in a general aspect of the present invention, a deeper periphery junction is formed to contain the extended portion of the junction silicide.

In a method and system for characterizing bulk leakage current of a junction, a center junction surrounded by an isolation structure is formed with a first depth. In addition, at least one periphery junction having a second depth greater than the first depth is formed in a portion of the center junction adjacent the isolation structure.

In a further embodiment of the present invention, a junction silicide is formed with the center and periphery junctions. When the center and periphery junctions are formed in a P-well, a magnitude of a reverse-bias voltage across the junction silicide and the P-well is incremented for determining a critical magnitude of the reverse-bias when current through the junction silicide and the P-well reaches a threshold current density.

In another embodiment of the present invention, the center and periphery junctions have N-type conductivity and are formed in the P-well.

In yet a further embodiment of the present invention, formation of the center junction includes implanting a core dopant and a drain side dopant into the center junction with such implantations also simultaneously forming drain bit line junctions of a flash memory device.

In another embodiment of the present invention, formation of the periphery junction includes implanting a periphery dopant into the periphery junction. In addition, a co-implant dopant may also be implanted into the periphery junction. In an example embodiment, implantations of the periphery and co-implant dopants are performed also for simultaneously forming a source and a drain of a field effect transistor in a periphery region of a flash memory device.

In an additional embodiment, the center and periphery junctions are formed within scribe lines of a semiconductor substrate having the flash memory device fabricated thereon.

In this manner, the periphery junction with the deeper depth contains any extended portion of the junction silicide adjacent the isolation structure. Thus, the bulk component of the leakage current through the interface between the junctions and the P-well is accurately determined without tainting from leakage current through an extended portion of the junction silicide.

These and other features and advantages of the present invention will be better understood by considering the following detailed description of the invention which is presented with the attached drawings.

The figures referred to herein are drawn for clarity of illustration and are not necessarily drawn to scale. Elements having the same reference number in FIGS. 1, 2, 3, 4, 5, 6, 7, 8, 9, 10, 11, 12, 13, 14, 15, 16, 17, 18, and 19 refer to elements having similar structure and function.

DETAILED DESCRIPTION

Figure 8:
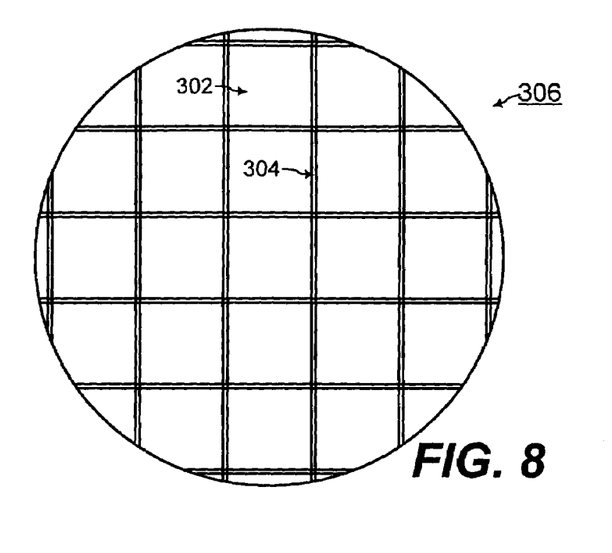
FIG. 8 shows a semiconductor substrate with a plurality of die for fabricating flash memory devices thereon and with scribe lines for fabricating test structures thereon, according to an embodiment of the present invention.

Referring to FIG. 8, a plurality of die, such as an example dice 302, are fabricated bounded by scribe lines, such as an example scribe line 304, on a semiconductor substrate 306 which may be a silicon wafer for example. Each dice 302 has an integrated circuit, such as a flash memory device for example, fabricated therein.

The present invention is described for characterizing bulk leakage current for drain bit line junctions of flash memory cells. However, the present invention may also advantageously be applied when characterizing bulk leakage current for any other junction of other types of integrated circuits.

Figure 15:
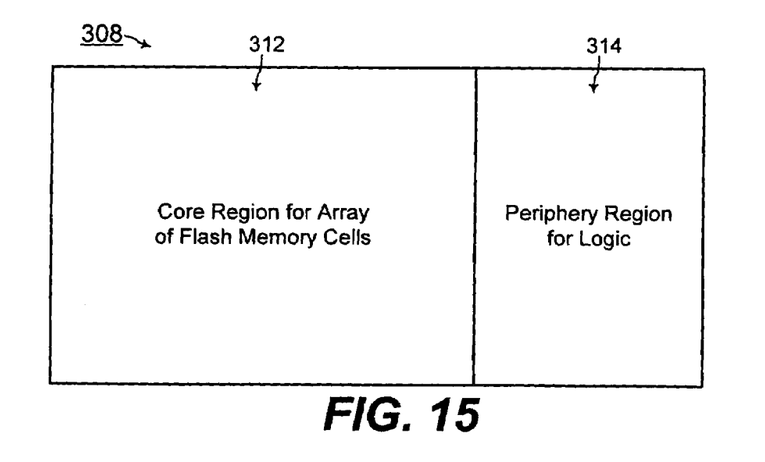
FIG. 15 shows a flash memory device divided into a core region for an array of flash memory cells and a periphery region for logic.

Referring to FIGS. 8 and 15, for the case of flash memory devices, each dice 302 has a flash memory device 308 fabricated thereon. The flash memory device 308 is typically comprised of a core region 312 having an array of flash memory cells fabricated thereon, such as the array 200 of FIG. 3 for example. In addition, the flash memory device 308 is typically also comprised of a periphery region 314 fabricated thereon. The periphery region 314 contains logic circuitry formed with field effect transistors for controlling operation of the array of flash memory cells fabricated within the core region 312.

Figure 9:
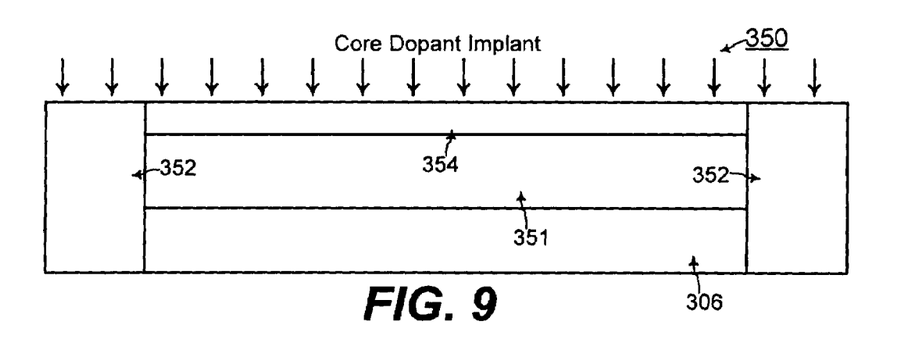
FIGS. 9, 10, 11, 12, 13, 16, and 17 show cross-sectional views illustrating fabrication of a test junction with an additional periphery junction for containing an extended portion of the junction silicide adjacent an isolation structure, according to an embodiment of the present invention.

Referring to FIG. 9, for fabricating a test junction 350 according to an embodiment of the present invention, a P-well 351 is formed within an active region of the semiconductor substrate 306 surrounded by a STI (shallow trench isolation) structure 352. In addition, a core dopant is implanted into the P-well 315 to form a center junction 354 (step 502 of FIG. 19). In one embodiment of the present invention, the test junction 350 of FIG. 9 is fabricated within the scribe line 304.

Figure 10:
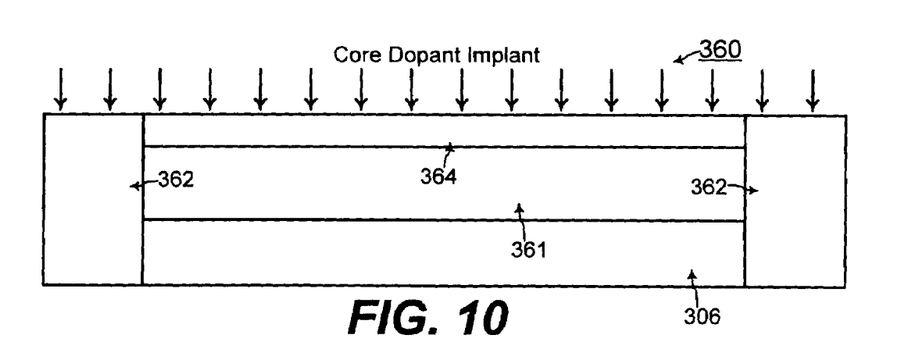

Referring to FIG. 10, flash memory cells, such as an example flash memory cell 360 of FIG. 10, are fabricated within a dice 302 for fabricating a flash memory device. The process for implanting the core dopant to form the center junction 354 in FIG. 9 also simultaneously forms a core junction 364 within a P-well 361 surrounded by a STI (shallow trench isolation) structure 362, in one aspect of the present invention. The core dopant typically is a P-type dopant such as boron for example.

Figure 11:
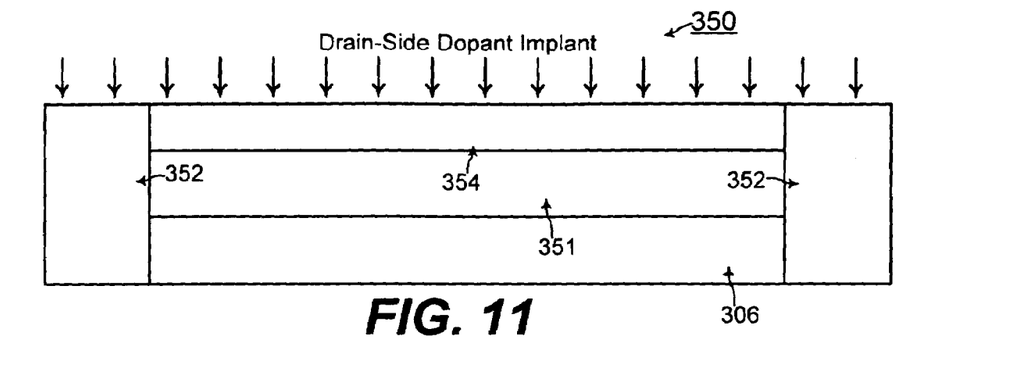
Figure 12:
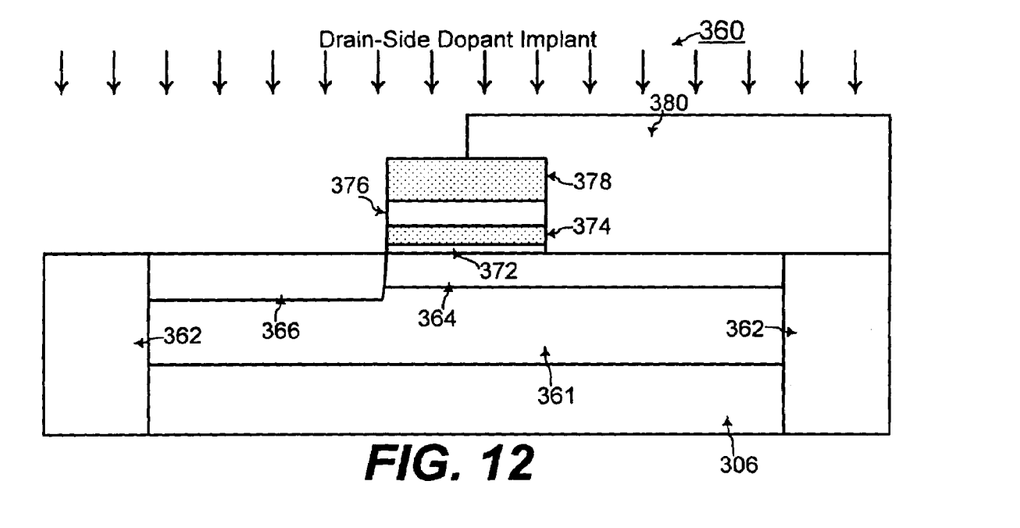
Figure 19:
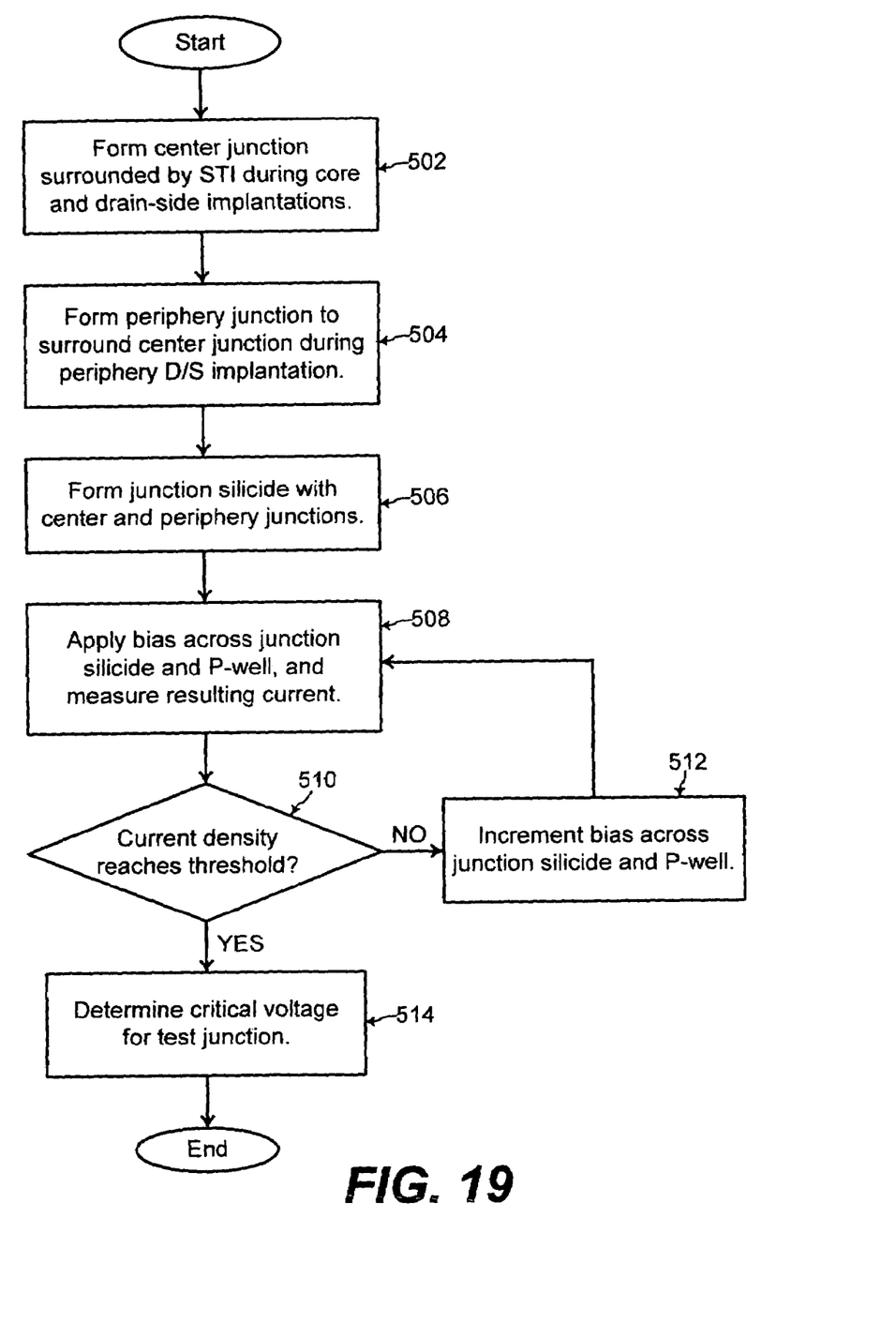
FIG. 19 shows a flow-chart of steps for a method of characterizing bulk leakage current of drain bit line junctions of a flash memory device, according to an embodiment of the present invention.

Referring to FIG. 11, after the core dopant implant, a drain-side dopant is implanted to form the center junction 354 (step 502 of FIG. 19). Referring to FIG. 12, the process for implanting the drain-side dopant for the center junction 354 in FIG. 11 also simultaneously forms a drain bit line junction 366 for the flash memory cell 360. The process for implanting the drain-side dopant in FIGS. 11 and 12 is performed after a gate stack for the flash memory cell 360 is formed.

The gate stack for the flash memory cell 360 in FIG. 12 includes a tunnel dielectric 372, a floating gate structure 374, a floating dielectric 376, and a control gate structure 378. The right-half toward the source side in FIG. 12 has an implant mask structure 380, comprised of photo-resist material for example, formed thereon such that the drain-side dopant is not implanted into the source side. The drain-side dopant is typically an N-type dopant, such as arsenic for example, and after the drain-side implantation, the resulting center junction 354 is N-type. The composition of the center junction 354 in FIG. 11 substantially emulates that of the drain bit line junction 366 of FIG. 12.

Figure 13:
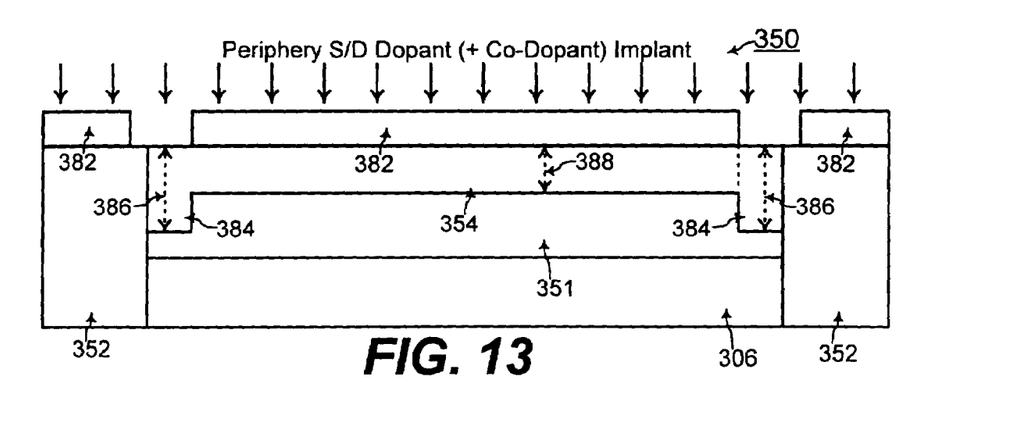
Figure 14:
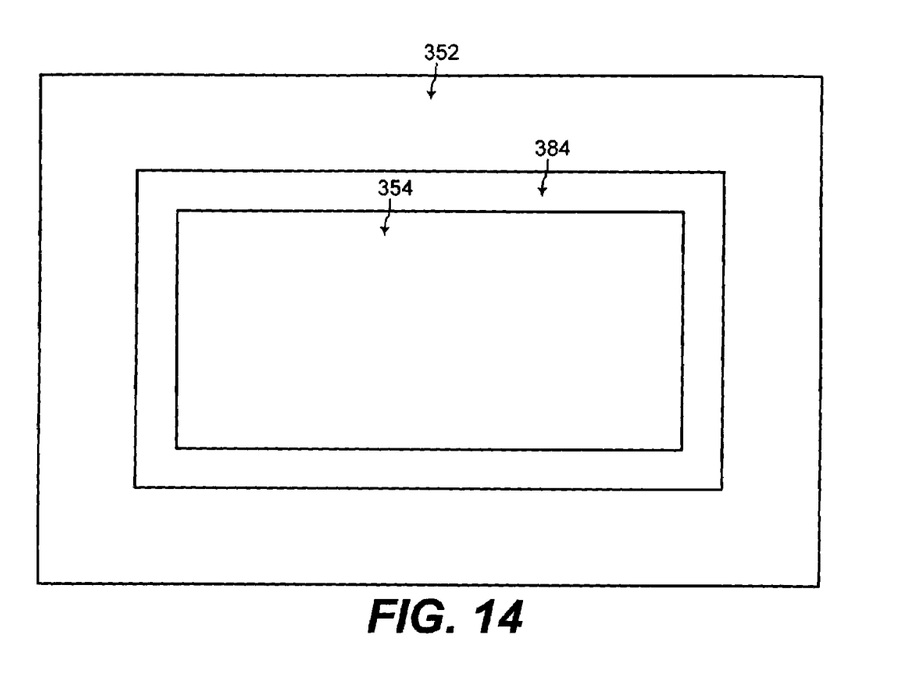
FIG. 14 shows a top view of the test junction, according to an embodiment of the present invention.

After such formation of the center junction, referring to FIG. 13, a periphery S/D (source/drain) dopant is implanted to form a periphery junction 384 adjacent the STI structure 352 (step 504 of FIG. 19). In one embodiment of the present invention, a mask structure 382, comprised of photo-resist material for example, is formed with an opening over the periphery junction 384 such that the periphery S/D dopant is implanted into the area for just the periphery junction 384. FIG. 14 shows a top view of the periphery junction 384 formed adjacent the STI structure 352 around the outer region of the center junction 354.

Further referring to FIG. 13, a depth 386 of the periphery junction 384 is higher (such as twice as higher for example) than a depth 388 of the center junction 354. The periphery S/D dopant is an N-type dopant such as arsenic for example. When the drain-side dopant for FIG. 11 and the periphery S/D dopant for FIG. 13 are both comprised of arsenic, the higher depth for the periphery junction 384 in FIG. 13 is attained by using higher dose and higher implantation energy during the implantation process for forming the periphery junction 384 in FIG. 13.

Figure 16:
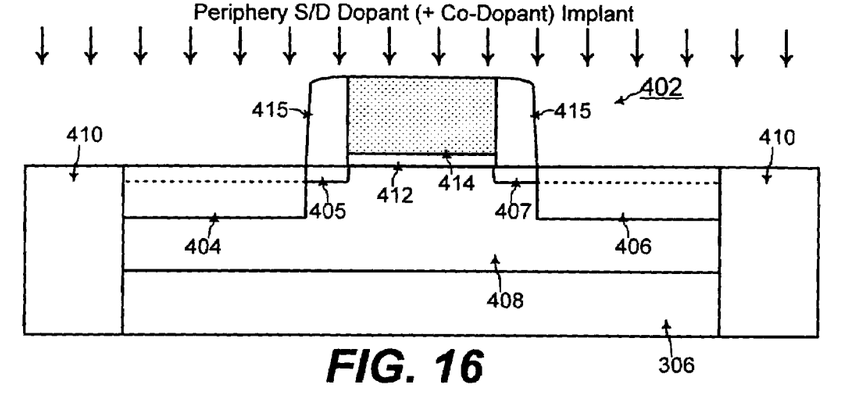

Referring to FIGS. 13 and 16, the process for implanting the periphery S/D dopant for the periphery junction 384 in FIG. 13 also simultaneously forms a drain 404 and a source 406 of a field effect transistor 402. Referring to FIG. 15, the flash memory cell 360 of FIG. 12 is formed within the core region 312 of the flash memory device 308, and the field effect transistor 402 is formed within the periphery region 314 of the flash memory device 308.

Referring to FIG. 16, the drain 404 and source 406 of the MOSFET (metal oxide semiconductor field effect transistor) 402 is formed within a P-well 408 surrounded by a STI (shallow trench isolation) structure 410. The drain 404 and source 406 are formed after formation of a gate dielectric 412, a gate structure 414, a lightly doped drain region 405, a lightly doped source region 407, and spacer 415 of the MOSFET 402.

In addition, a co-dopant may also be implanted into the periphery junction 384 and the drain and source 404 and 406 of the MOSFET 402. For example, the drain and source 404 and 406 of the MOSFET 402 may be desired to include another dopant of high diffusivity. An example is the periphery S/D dopant being comprised of arsenic, and the co-dopant being comprised of phosphorous.

Figure 17:
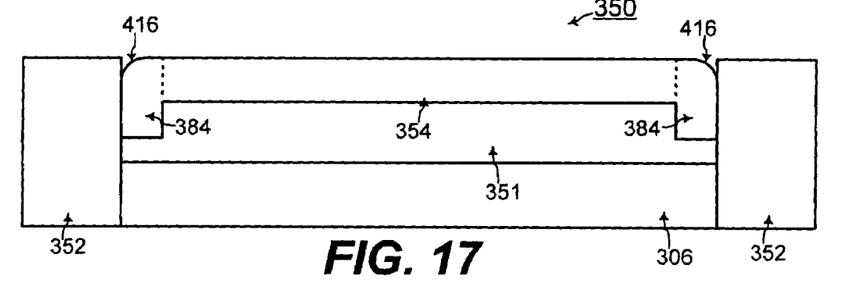
Figure 18:
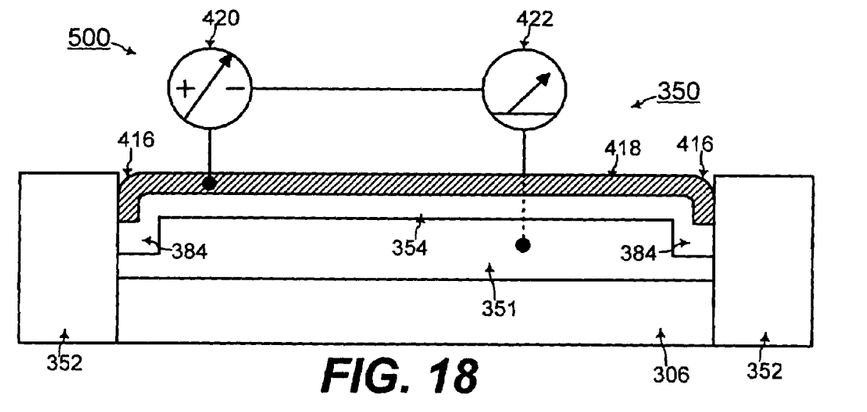
FIG. 18 shows a system including the test junction and components for characterizing the bulk junction leakage current, according to an embodiment of the present invention.

Referring to FIGS. 13 and 17, after formation of the periphery junction 384, the masking structure 382 is etched away. In addition, during any such subsequent etching process, top corners 416 toward the STI structure 352 of the testing junction 350 are etched to be rounded. Referring to FIG. 18, a junction silicide 418 is formed with exposed surfaces of the periphery junction 384 and the center junction 354 (step 506 of FIG. 19). Generally, silicide provides low resistance contact to a junction.

In this manner, the test junction 350 is formed of the center junction 354 and the periphery junction 384. When the junction silicide 418 is formed at the rounded corners 416, the junction silicide 418 extends deeper down at such rounded corners 416. However, the deeper periphery junction 384 contains the junction silicide 418 such that the junction silicide 418 does not punch through into the P-well 351. Thus, the extending portion of the junction silicide 418 at the corners 416 does not contribute a significant leakage current component.

The center junction 354 of FIG. 18 is formed to emulate the drain bit line junction 366 of FIG. 12. The bulk leakage current through the center junction 354 of FIG. 18 is desired to be characterized to monitor the quality of the drain bit line junctions of the flash memory device 308. Further referring to FIG. 18, a system 500 for such a characterization includes the test junction 350 comprised of the center junction 354, the periphery junction 384, and the junction silicide 418.

In addition, the system 500 includes a variable voltage source 420 for applying a bias voltage across the junction silicide 418 and the P-well 351 (step 508 of FIG. 19) such that a reverse-bias is applied across the P-well 351 and the N-type center and periphery junctions 354 and 384. Furthermore, the system 500 includes a current meter 422 for measuring a current through the silicide 418 and the P-well 351 from such a reverse-bias voltage (step 508 of FIG. 19).

For quantifying the leakage current, the current measured by the current meter 422 is compared with a threshold value (step 510 of FIG. 19). In an example embodiment, a current density that takes into account the horizontal area of the center and periphery junctions 354 and 384 (as shown in FIG. 14) is compared with a threshold value. If the measured current density does not reach the threshold value, the magnitude of the reverse-bias voltage from the voltage source 420 is incremented (step 512 of FIG. 19), and steps 508 and 510 are repeated.

In this manner, steps 508, 510, and 512 are repeated until the current density measured by the current meter 422 reaches the threshold value at step 510. At that point, the magnitude of the reverse-bias from the voltage source 420 is the "critical voltage" of the test junction 350 (step 514 of FIG. 19). Such a critical voltage quantifies the quality of the test junction 350 and thus of the drain bit line junction 366.

According to such aspects of the present invention, the extended portion of the junction silicide 418 at the corners 416 is contained within the periphery junction 384. Thus, current flowing through such an extended portion of the junction silicide 418 does not contribute significantly to the current measured at the current meter 422 and thus does not taint the characterization of the bulk leakage current between the center and periphery junctions 354 and 384 and the P-well 351. Furthermore, the test junction 350 is fabricated simultaneously using processes for fabricating parts of the flash memory device 308. Thus, additional fabrication steps are not added for fabricating the test junction 350, according to an embodiment of the present invention.

The foregoing is by way of example only and is not intended to be limiting. For example, the present invention herein is described for characterizing bulk leakage current for the drain bit line junctions of flash memory cells. However, the present invention may also advantageously be applied when characterizing bulk leakage current for any other junction of other types of integrated circuits. In addition, the materials described herein are by way of example only. Furthermore, any dimensions or parameters specified herein are by way of example only. The present invention is limited only as defined in the following claims and equivalents thereof.

We claim:

1. A method of characterizing leakage current of a junction, comprising:
   forming a center junction having a first depth and being surrounded by an isolation structure;
   forming at least one periphery junction having a second depth greater than the first depth in a portion of the center junction adjacent the isolation structure; and
   forming the center and periphery junctions to abut a P-well that is uniformly doped under the center and periphery junctions.

2. The method of claim 1, further comprising:
   forming a junction silicide with the center and periphery junctions.

3. A method of characterizing leakage current of a junction, comprising:
   forming a center junction having a first depth and being surrounded by an isolation structure;
   forming at least one periphery junction having a second depth greater than the first depth in a portion of the center junction adjacent the isolation structure;
   forming a junction silicide with the center and periphery junctions;
   forming the center and periphery junctions in a P-well;
   incrementing a magnitude of a reverse-bias across the junction silicide and the P-well; and
   determining a critical magnitude of the reverse-bias when current through the junction silicide and the P-well reaches a threshold current density.

4. The method of claim 1, wherein the center and periphery junctions have N-type conductivity.

5. The method of claim 1, wherein formation of the center junction includes:

implanting a core dopant into the center junction; and
implanting a drain side dopant into the center junction.

6. The method of claim 5, wherein the implantations of the core and drain side dopants are performed also for forming drain bit line junctions of a flash memory device.

7. The method of claim 1, wherein formation of the periphery junction includes:
   implanting a periphery dopant into the periphery junction.

8. The method of claim 7, wherein formation of the periphery junction further includes:
   implanting a co-implant dopant into the periphery junction.

9. The method of claim 8, wherein implantations of the periphery and co-implant dopants are performed also for forming a source and a drain of a field effect transistor in a periphery region of a flash memory device.

10. The method of claim 1, wherein the center and periphery junctions are formed within scribe lines of a semiconductor substrate having a flash memory device fabricated thereon.

11. A test system for characterizing leakage current for a junction, comprising:
   a center junction formed to have a first depth and to be surrounded by an isolation structure;
   at least one periphery junction formed to have a second depth greater than the first depth in a portion of the center junction adjacent the isolation structure; and
   a P-well containing the center and periphery junctions with the P-well being uniformly doped in abutting the center and periphery junctions.

12. The test system of claim 11, further comprising:
   a junction silicide formed with the center and periphery junctions.

13. The test system of claim 12, further comprising:
   means for incrementing a magnitude of a reverse-bias across the junction silicide and the P-well to determine a critical magnitude of the reverse-bias when current through the junction silicide and the P-well reaches a threshold current density.

14. The test system of claim 11, wherein the center and periphery junctions have N-type conductivity.

15. The test system of claim 11, wherein the center junction comprises:
   a core dopant implanted into the center junction; and
   a drain side dopant implanted into the center junction.

16. The test system of claim 15, wherein the core and drain side dopants also comprise bit line junctions of flash memory cells of a flash memory device within a semiconductor substrate having the center and periphery junctions and the flash memory device fabricated thereon.

17. The test system of claim 11, wherein the periphery junction includes:
   a periphery dopant implanted into the periphery junction.

18. The test system of claim 17, wherein the periphery junction further includes:
   a co-implant dopant implanted into the periphery junction.

19. The test system of claim 18, wherein the periphery and co-implant dopants also comprise a source and a drain of a field effect transistor in a periphery region of a flash memory device.

20. The test system of claim 11, wherein the center and periphery junctions are formed within scribe lines of a semiconductor substrate having a flash memory device fabricated thereon.

\* \* \* \* \*